United States Patent
Jeon et al.

(10) Patent No.: US 7,710,788 B2
(45) Date of Patent: May 4, 2010

(54) FLASH MEMORY DEVICE AND METHOD OF TESTING A FLASH MEMORY DEVICE

(75) Inventors: Hong-Soo Jeon, Suwon-si (KR); Dae-Han Kim, Gangdong-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 180 days.

(21) Appl. No.: 11/923,875

(22) Filed: Oct. 25, 2007

(65) Prior Publication Data

US 2008/0117705 A1 May 22, 2008

(30) Foreign Application Priority Data

Nov. 22, 2006 (KR) .................... 10-2006-0116022

(51) Int. Cl.
*G11C 11/03* (2006.01)
(52) U.S. Cl. ............ 365/185.33; 365/194; 365/225.7; 365/226
(58) Field of Classification Search ........... 365/225.7, 365/185.33, 189.12, 189.09, 194, 226
See application file for complete search history.

(56) References Cited

U.S. PATENT DOCUMENTS

| 7,280,415 B2 * | 10/2007 | Hwang et al. ......... 365/189.09 |
| 2005/0018483 A1 * | 1/2005 | Imamiya et al. ....... 365/185.09 |
| 2005/0077923 A1 * | 4/2005 | Kim et al. ............. 327/50 |
| 2006/0279442 A1 * | 12/2006 | Kimura et al. ......... 341/121 |

FOREIGN PATENT DOCUMENTS

| JP | 2002-343868 | 11/2002 |
| KR | 1020000020229 A | 4/2000 |
| KR | 1020000020299 A | 4/2000 |
| KR | 1020040006416 A | 1/2004 |

* cited by examiner

*Primary Examiner*—Pho M. Luu
(74) *Attorney, Agent, or Firm*—Volentine & Whitt, P.L.L.C.

(57) ABSTRACT

A flash memory device includes a flash fuse cell array, a trim code processing unit, a flash memory array, and a regulator. The fuse cell array, which includes multiple nonvolatile fuse cells, is configured to store a first trim code. The trim code processor is configured to generate a second trim code based on the first trim code provided by the fuse cell array and a voltage control code. The flash memory array includes multiple flash memory cells. The regulator is configured to generate a high voltage in response to the second trim code and to provide the high voltage to the flash memory array. The high voltage varies according to erase, program and read operations of the flash memory cells.

10 Claims, 4 Drawing Sheets

FLASH MEMORY DEVICE AND METHOD OF TESTING A FLASH MEMORY DEVICE

CROSS-REFERENCE TO RELATED APPLICATIONS

A claim of priority is made to Korean Patent Application No. 10-2006-0116022, filed on Nov. 22, 2006, the subject matter of which is hereby incorporated by reference.

BACKGROUND OF THE INVENTION

1. Field of the Invention

The present invention relates to flash memory device testing, and more particularly, the present invention relates to a flash memory device having a fuse cell array and a method of testing a flash memory device.

2. Description of the Related Art

Recently, various flash memory devices have been developed, which include additional circuits, such as a controller and a voltage regulator, as well as a flash fuse cell array. Most flash memory devices normally operate at voltage of about 1V through 3V. However, a high voltage, which may be several times the normal voltage, is required for erase, program and read operations. Therefore, the regulator of a flash memory device is a kind of a DC to DC converter, which generates a high voltage from a low voltage and provides the high voltage to a flash memory cell array having multiple memory cells.

However, because of errors which may occur during the semiconductor fabrication process, the regulator may not generate the required high voltage. Because the level of the high voltage affects stability and life span of products, and because errors in a semiconductor fabrication process are inevitable, a general test process measures the voltage output from the regulator and appropriately corrects the voltage using a trim circuit. The trim circuit includes a fuse circuit that is set to output a trim code for correcting the errors in the voltage. The regulator receives the trim code from the fuse circuit and outputs the corrected high voltage.

A conventional fuse circuit includes a fuse array that connects or disconnects internal fuses, as needed, using a laser, etc. A limitation of the fuse array is that a trim code is set only one time.

FIG. 1 is a block diagram illustrating a conventional flash fuse cell array.

Referring to FIG. 1, a flash fuse cell array 10, acting like a fuse, turns programmable flash cells 11 through 18 on/off and generates trim codes TR0 through TR3 through sense amplifiers 19A through 19D, respectively. The trim codes TR0 through TR3 are applied to a voltage control unit of a regulator (not shown) and are used by the regulator to output the appropriate voltage. Even when the power is off, each of the flash cells 11 through 18 may maintain the set trim codes and may reset the trim codes since the flash cells are non-volatile.

The flash fuse cell array 10 may store two kinds of trim codes. When a first word line W0 and each of bit lines B0 through B3 are activated, a first trim code is output. When a second word line W1 and each of the bit lines B0 through B3 are activated, a second trim code is output. Source lines S0 and S1 are generally connected to a ground voltage.

FIG. 2 is a block diagram illustrating a conventional flash memory device.

Referring to FIG. 2, in a high voltage output test of a flash memory device, a high voltage regulator 20 outputs a predetermined high voltage VPP according to a default code output from a flash fuse cell array, such as the flash fuse cell array 10 of FIG. 1. The regulator 20 includes a decoder 21, a reference voltage generator 22, a voltage control unit 23, and a pumping unit 24. The decoder 21 decodes an input trim code. For example, when a 4-bit trim code (TR0 through TR3) is provided to the decoder 21, the decoder 21 decodes the trim code and provides 16-bit binary codes D0 through D15. The reference voltage generator 22 generates a reference voltage VR. The voltage control unit 23 includes a series resistor array RL, R0 though R15, and switches that may change the connection of resistors. When a total resistance of the resistor array is changed according to the binary codes, a voltage applied to the pumping unit 24 can be changed, and thus controlling a level of the high voltage VPP.

A tester 25 measures the high voltage VPP, and compares the level of the high voltage VPP with a level of a required high voltage, and generates a pertinent trim code signal TRIM CODE according to the result of the comparison. The trim code TRIM CODE is again applied to the flash fuse cell array 10, and is stored in the flash cells of the flash fuse cell array 10.

However, it is often necessary to temporarily change the level of the high voltage VPP of the regulator 20, according various types of tests which may be performed after correcting the regulator 20. In a conventional flash memory device, whenever the level of the high voltage VPP must changed, the trim code TRIM CODE for the high voltage VPP of the changed level must be stored in the flash fuse cell array 10. Generally, in the mass production of flash memory devices, the produced devices are simultaneously tested. However, memory devices with different correction characteristics cannot be simultaneously tested by the conventional method.

SUMMARY OF THE INVENTION

An aspect of the present invention provides a flash memory device, including a fuse cell array, a trim code processor, a flash memory array and a regulator. The fuse cell array includes multiple nonvolatile fuse cells and is configured to store a first trim code. The trim code processor is configured to generate a second trim code based on the first trim code provided by the fuse cell array and a voltage control code. The flash memory array includes multiple flash memory cells. The regulator is configured to generate a high voltage in response to the second trim code and to provide the high voltage to the flash memory array. The high voltage varies according to erase, program and read operations of the flash memory cells.

The trim code processor may include a first register configured to store the first trim code, a second register configured to store the voltage control code, and a calculator configured to generate the second trim code by adding or subtracting the voltage control code to or from the first trim code. The voltage control code may be extracted from a test command provided to the flash memory device to control testing of the flash memory device. The voltage control code includes information about a displacement value of the high voltage level. The calculator may add or subtract the voltage control code to or from the first trim code in response to the test command.

Another aspect of the present invention provides a method of testing a flash memory device, which includes a flash fuse cell array having nonvolatile fuse cells, and a regulator for generating a high voltage based on information output from the flash fuse cell array. The method includes setting a first trim code in the flash fuse cell array, the first trim code for correcting a level of the high voltage generated by the regulator; generating a second trim code based on the first trim code and a voltage control code; and generating the high voltage having a corrected level in response to the second trim code.

The method may further include receiving a test command and extracting the voltage control code from the test command to control testing of the flash memory device. The voltage control code represents information about a displacement value of the high voltage level. Also, generating the second trim code may include adding or subtracting the voltage control code to or from the first trim code, according to the test command.

The method may further include providing the voltage control code to at least one other flash memory device being simultaneously tested. Also, the method may include maintaining the first trim code during the testing.

Yet another aspect of the present invention provides an electronic circuit, including a flash fuse cell array, a trim code processor and a regulator. The flash fuse cell array, which includes nonvolatile fuse cells, is configured to store a first trim code. The trim code processor is configured to generate a second trim code based on the first trim code and a voltage control code. The regulator is configured to generate a high voltage in response to the second trim code.

The trim code processor of the electronic circuit may include a first register configured to store the first trim code received from the flash fuse cell array, a second register configured to store the voltage control code, and a calculator configured to calculate the second trim code based on the first trim code and a voltage control code. The voltage control code may be extracted from a test command received by the trim code processor, the voltage control code indicating a displacement value of the high voltage level. The calculator may be configured to add or subtract the voltage control code to or from the first trim code in response to the test command to calculate the second trim code. The first trim code stored in the flash fuse cell array may be maintained while the high voltage is generated in response to the second trim code.

BRIEF DESCRIPTION OF THE DRAWINGS

The embodiments of the present invention will be described with reference to the attached drawings, in which.

DESCRIPTION OF THE EMBODIMENTS

Figure 1:
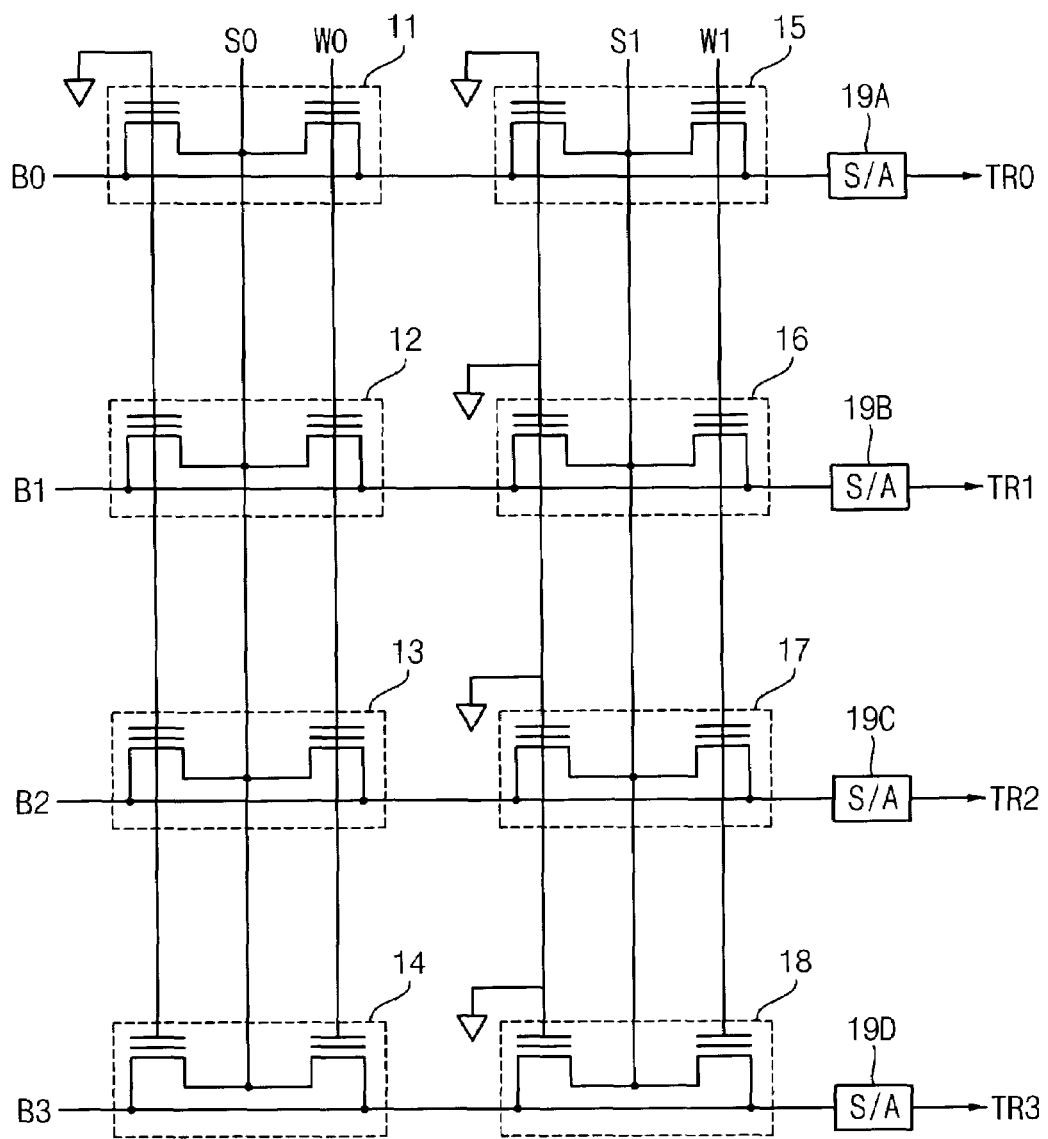
FIG. 1 is a block diagram illustrating a conventional flash fuse cell array.
Figure 2:
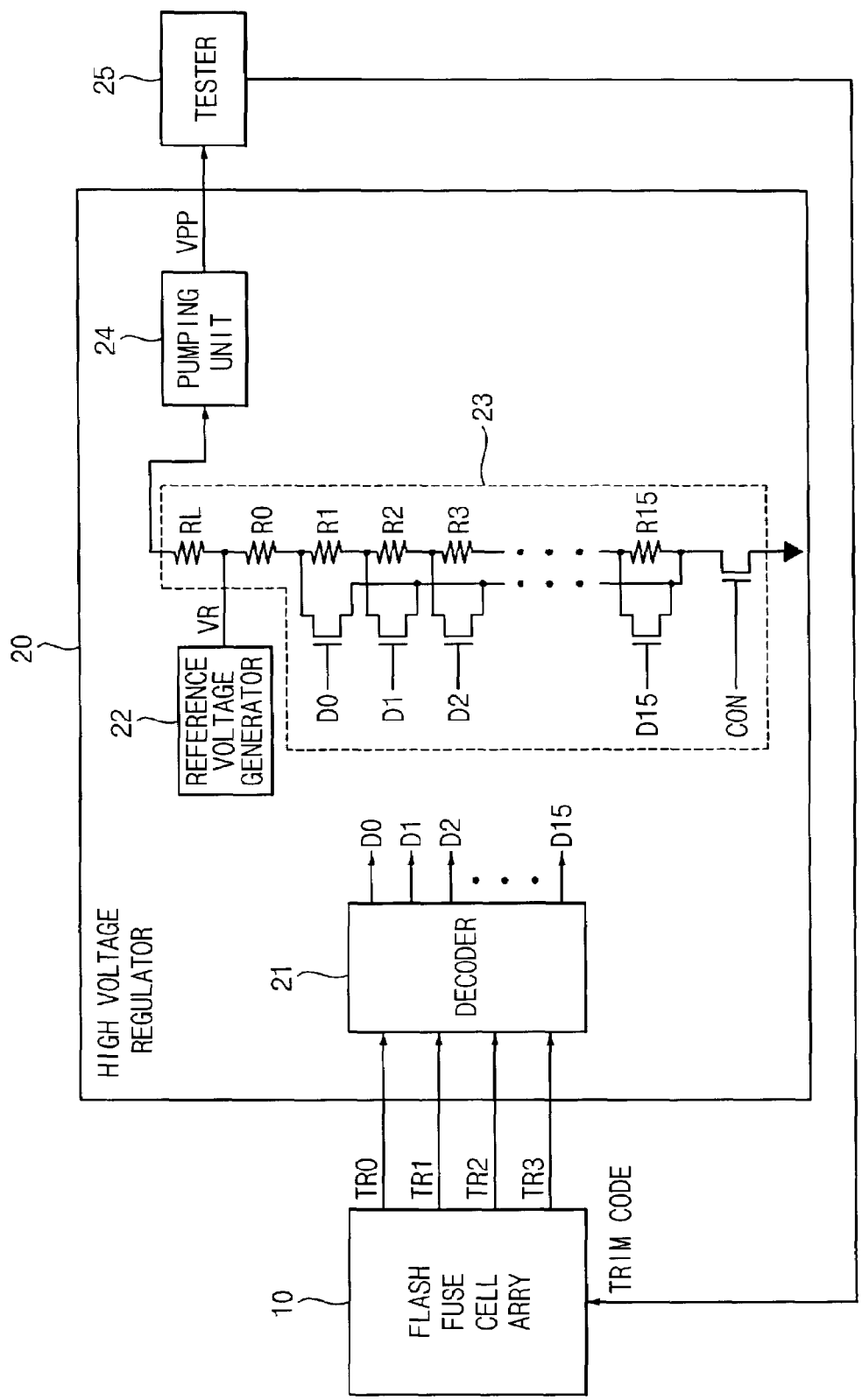
FIG. 2 is a block diagram illustrating a conventional flash memory device.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals is used to refer to like or similar elements.

It is understood that, although the terms first, second, etc., may be used herein to describe various elements, these elements should not be limited by these terms. These terms are used to distinguish one element from another. For example, a first element could be termed a second element, and similarly, a second element could be termed a first element, without departing from the spirit and scope of the present invention. Also, as used herein, the term "and/or" includes any and all combinations of one or more of the associated listed items.

It is understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. The singular forms "a," "an" and "the" are intended to include the plural forms as well, unless the context clearly indicates otherwise. It is further understood that the terms "comprises," "comprising," "includes" and/or "including," specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It is further understood that terms, such as those defined in commonly used dictionaries, should be interpreted as having a meaning that is consistent with their meaning in the context of the relevant art, and will not be interpreted in an idealized or overly formal sense unless expressly so defined herein.

Figure 3:
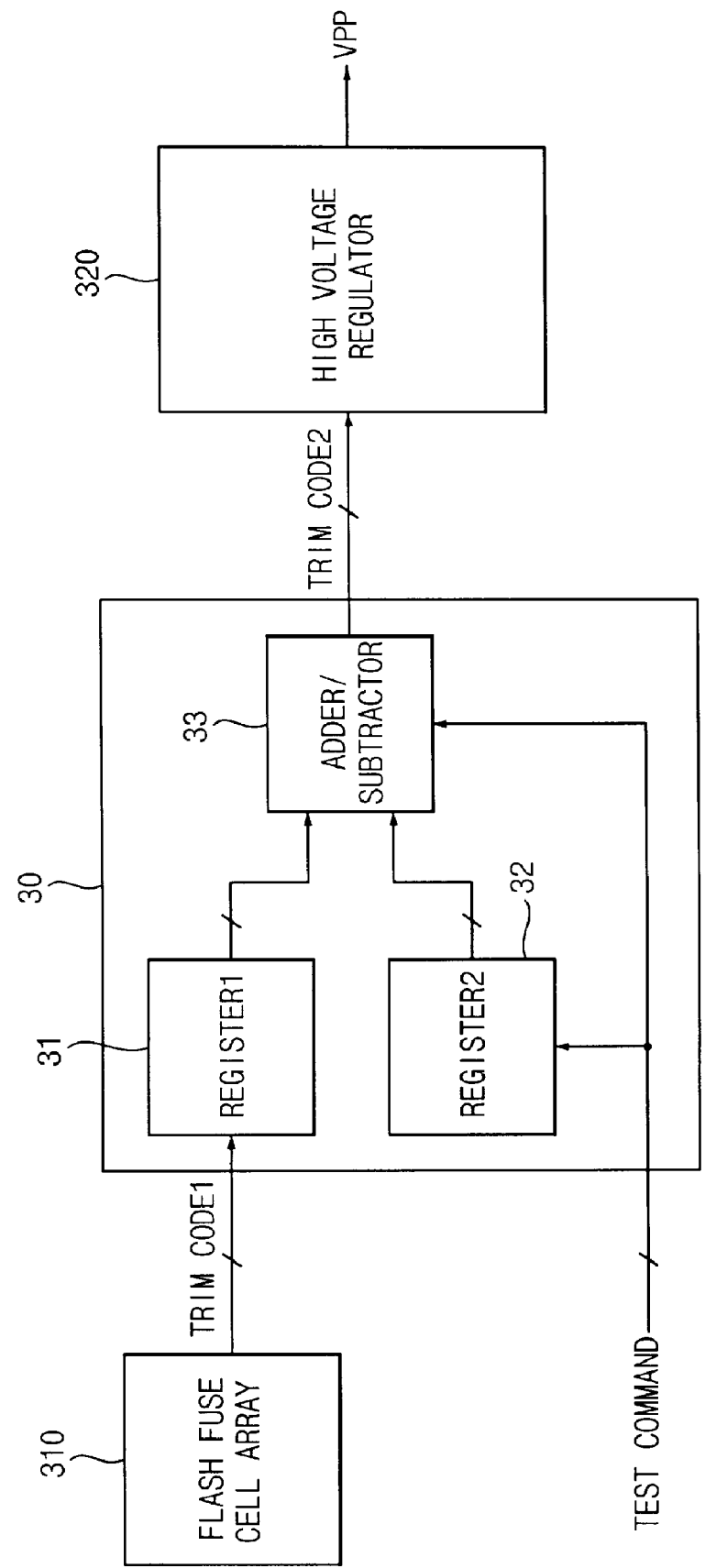
FIG. 3 is a block diagram illustrating a flash memory device, according to an exemplary embodiment of the present invention.

FIG. 3 is a block diagram illustrating a flash memory device, according to an illustrative embodiment of the present invention.

Referring to FIG. 3, the flash memory device includes a flash fuse cell array 310, such as the flash fuse cell 10 illustrated in FIG. 1, for example. The flash fuse cell array 310 is set to output a first trim code TRIM CODE1. The trim code processing unit 30 receives the first trim code TRIM CODE1 from the flash fuse cell array 310, and processes the first trim code TRIM CODE1 based on a test command signal TEST COMMAND received from an external tester (not shown) to generate a second trim code TRIM CODE2.

A high voltage regulator 320, such as the high voltage regulator 20 illustrated in FIG. 1, for example, generates and outputs a high voltage VPP in response to the second trim code TRIM CODE2, and provides the high voltage VPP to a flash memory cell array (not shown) of the flash memory device, the flash memory cell array including multiple memory cells (not shown). The regulator 320 may generate the high voltage VPP such that the high voltage VPP linearly increases or decreases according to the second trim code TRIM CODE2.

The trim code processing unit 30 includes a first register REGISTER1 31, a second register REGISTER2 32, and a calculating unit (adder/subtractor) 33. The first register 31 receives the first trim code TRIM CODE1 from the flash fuse cell array 310 and stores the first trim code TRIM CODE1. The second register 32 receives the test command TEST COMMAND and stores a voltage control code that is extracted from the test command TEST COMMAND. The first trim code TRIM CODE1 corresponds to information for correcting an offset of a high voltage VPP generated by the regulator 320. The voltage control code corresponds to information for changing a level of the high voltage VPP when the high voltage VPP of the regulator 320 must be temporarily varied. The calculating unit 33 generates the second trim code TRIM CODE2 by adding the voltage control code to the first trim code TRIM CODE1 or by subtracting the voltage control code from the first trim code TRIM CODE1, in response to the test command TEST COMMAND.

Figure 4:
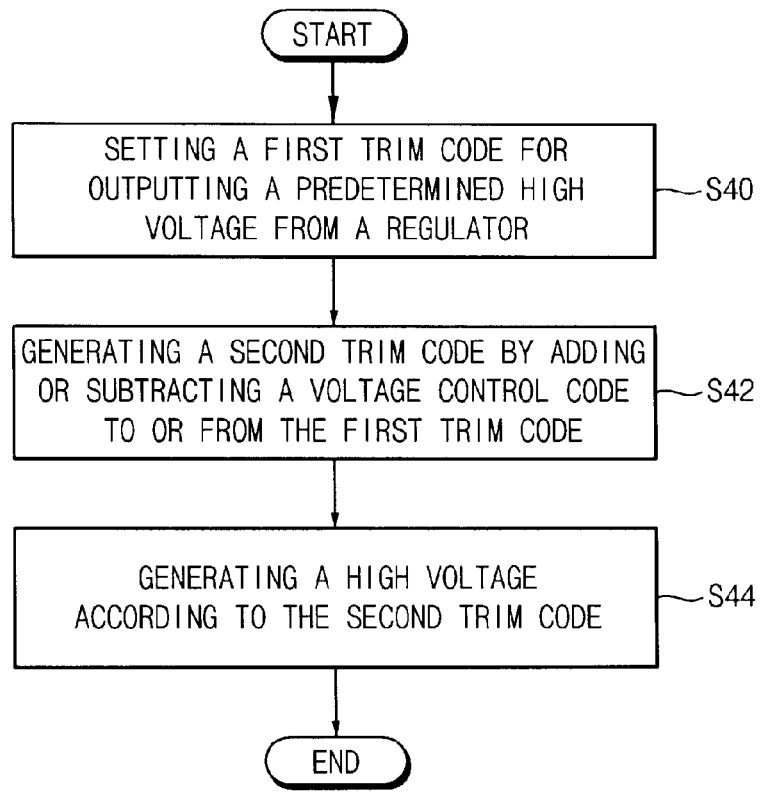
FIG. 4 is a flow chart illustrating a method of testing a flash memory device, according to an exemplary embodiment of the present invention.

FIG. 4 is a flow chart illustrating a method of testing a flash memory device, according to an illustrative embodiment of the present invention.

Referring to FIG. 3 and FIG. 4, the first trim code TRIM CODE1 is set such that the regulator 320 outputs the required high voltage (step S40). Setting the first trim code TRIM CODE1 may be performed by any appropriate method, including a conventional method, without departing from the spirit and scope of the present invention. For example, the tester (not shown) may measure the high voltage VPP in response to a default value of the first trim code TRIM CODE1. The tester may compare a level of the measured high voltage VPP and a level of the required high voltage, and correct the first trim code TRIM CODE1 until the required high voltage is output from the regulator 320. The corrected first trim code TRIM CODE1 is stored in the flash fuse cell array 310.

When another level of high voltage is required, the second trim code TRIM CODE2 is generated by increasing or decreasing the first trim code TRIM CODE1 based on a voltage control code representing a displacement value of the high voltage level (step S42). The second trim code TRIM CODE2 is applied to the regulator 320, which outputs a high voltage having an adjusted level in response to the second trim code TRIM CODE2 (step S44). Therefore, the flash memory device according to an exemplary embodiment of the present invention may immediately adjust the level of the high voltage without having to reset the first trim code TRIM CODE1, which is previously set in the flash fuse cell array 310.

For example, assuming that a high voltage VPP of 20V is used for reading, erasing, and/or programming the flash memory device, a corresponding first trim code TRIM CODE1 is set and stored in the flash fuse cell array 310. For example, assuming the default value of the first trim code TRIM CODE1 is previously set to 0010 and the measured high voltage VPP is 18V, the first trim code TRIM CODE1 must be corrected to 0011, for example, so that the measured high voltage VPP matches the required 20V. Thus, the corrected value 0011 is stored in the flash fuse cell array 310 as the first trim code TRIM CODE1. Likewise, if a high voltage VPP of 22V is used for reading, erasing, and/or programming the flash memory device, the first TRIM CODE 1 must be corrected to 0100, for example, so that the measured high voltage VPP is 22V. Thus, the corrected value 0100 is stored in the flash fuse cell array 310 as the first trim code TRIM CODE1.

Assuming again that the required high voltage VPP is 20V and that the corresponding set value of the first trim code TRIM CODE 1 is 0011, if a high voltage of 22V is used for testing the flash memory device, the test command TEST COMMAND applied to the flash memory device will include a voltage control code set as +0001. In response to this test command TEST COMMAND, the trim code processing unit 30 generates the second trim code TRIM CODE2 by adding the voltage control code of +0001 to the first trim code TRIM CODE1 of 0011. The second trim code TRIM CODE2 thus has a value of 0100 (i.e., 0011+0001), which corresponds to 22V. The regulator 320 outputs the high voltage VPP of 22V in response to the second trim code TRIM CODE2 of 0100 for testing purposes. Meanwhile, the first trim code TRIM CODE1 may be maintained at its set value.

Similarly, if a high voltage of 18V is used for testing the flash memory device, the test command TEST COMMAND applied to the flash memory device will include a voltage control code set as −0001. In response to this test command TEST COMMAND, the trim code processing unit 30 generates the second trim code TRIM CODE2 by subtracting the voltage control code of 0001 from the first trim code TRIM CODE1 of 0011. The second trim code TRIM CODE2 thus has a value of 0010 (i.e., 0011-0001), which corresponds to 18V. The regulator 320 outputs the high voltage VPP of 18V in response to the second trim code TRIM CODE2 of 0010 for testing purposes.

In various embodiments, the voltage control code may also be used to set the first trim code TRIM CODE1. For example, the first trim code TRIM CODE1 may be initially maintained at the default value while the first trim code TRIM CODE1 is being corrected based on measuring the high voltage VPP. That is, the voltage control code is adjusted according to a measured value of the high voltage VPP, but the first trim code TRIM CODE1 maintains the default value. The regulator 320 outputs the high voltage VPP having a level corresponding to the sum of the default value of the first trim code TRIM CODE1 and the corrected voltage control code. When the optimum high voltage VPP is obtained, the first trim code TRIM CODE1 is corrected by adding or subtracting the final voltage control code to or from the default value of the first trim code TRIM CODE1, and the corrected first trim code TRIM CODE1 is stored in the flash fuse cell array 310.

Figure 5:
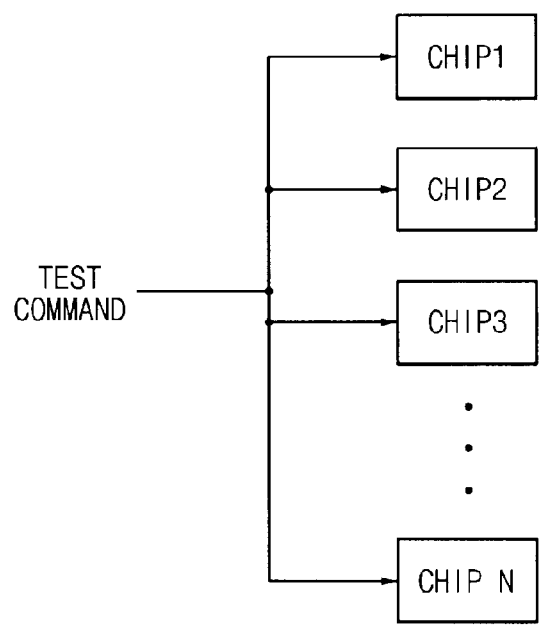
FIG. 5 is a block diagram illustrating parallel testing of the flash memory device of FIG. 3, according to an exemplary embodiment of the present invention.

FIG. 5 is a block diagram illustrating parallel testing of the flash memory devices in FIG. 3, according to an illustrative embodiment of the present invention.

Referring to FIG. 5, multiple flash memory devices CHIP 1 through CHIP N, each of which includes the exemplary flash memory device illustrated in FIG. 3, simultaneously receive a test command TEST COMMAND. As previously discussed, the test command TEST COMMAND includes information about a displacement value of a high voltage VPP level. Each flash fuse array 310, respectively included in the flash memory devices CHIP 1 through CHIP N, stores the corresponding predetermined first trim code TRIM CODE1 for outputting a high voltage VPP, which has a level required by the respective regulator 320.

Each of the trim code processing units 30 in the flash memory devices CHIP 1 through CHIP N extracts the information about the displacement value of the high voltage VPP level from the test command signal TEST COMMAND. The trim code processing units 30 respectively generate the second trim codes TRIM CODE2 by adding or subtracting the information about the extracted displacement value to or from the first trim codes TRIM CODE1 that are respectively set in the flash memory devices CHIP 1 through CHIP N. The respective trim code TRIM CODE2 is applied to the corresponding regulator 320, which outputs the adjusted high voltage VPP of an equal level for the flash memory device CHIP 1 through CHIP N, respectively.

In the testing described above, each of the regulators 320 may output the corresponding adjusted high voltage VPP based on the voltage control code representing the displacement value of the high voltage VPP level, without resetting the first trim code TRIM CODE1 stored in the flash memory cell. That is, according to an exemplary embodiment of the present invention, the first trim code TRIM CODE1 stored in the flash fuse cell array 310 does not need to be erased and reprogrammed for the purpose testing the flash memory device.

Even though the present invention has been described through embodiments including a flash memory device, it is understood that the present invention may be applied to any electronic circuit using a fuse cell and a trim code.

Also, as described above, the memory device and the method of testing a memory device according to exemplary embodiments of the present invention reduce test time. For example, flash fuse cells do not need to be erased and reprogrammed for testing, and the electronic circuits and/or flash memory devices may be tested without resetting the trim code.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A flash memory device, comprising:
   a fuse cell array configured to store a first trim code, the flash fuse cell array comprising a plurality of nonvolatile fuse cells;
   a trim code processor configured to generate a second trim code based on the first trim code provided by the fuse cell array and a voltage control code;
   a flash memory array comprising a plurality of flash memory cells; and
   a regulator configured to generate a high voltage in response to the second trim code and to provide the high voltage to the flash memory array, the high voltage varying according to erase, program and read operations of the flash memory cells,
   wherein the trim code processor comprises:
      a first register configured to store the first trim code;
      a second register configured to store the voltage control code; and
      a calculator configured to generate the second trim code by adding or subtracting the voltage control code to or from the first trim code.

2. The flash memory device of claim 1, wherein the voltage control code is extracted from a test command provided to the flash memory device to control testing of the flash memory device, the voltage control code including information about a displacement value of the high voltage level.

3. The flash memory device of claim 2, wherein the calculator adds or subtracts the voltage control code to or from the first trim code in response to the test command.

4. A method of testing a flash memory device, the flash memory device comprising a flash fuse cell array, having nonvolatile fuse cells, and a regulator for generating a high voltage based on information output from the flash fuse cell array, the method comprising:
   setting a first trim code in the flash fuse cell array, the first trim code for correcting a level of the high voltage generated by the regulator;
   generating a second trim code based on the first trim code and a voltage control code;
   generating the high voltage having a corrected level in response to the second trim code;
   receiving a test command;
   extracting the voltage control code from the test command to control testing of the flash memory device, the voltage control code representing information about a displacement value of the high voltage level,
   wherein generating the second trim code comprises adding or subtracting the voltage control code to or from the first trim code, according to the test command.

5. The method of claim 4, further comprising:
   providing the voltage control code to at least one other flash memory device being simultaneously tested.

6. The method of claim 4, further comprising:
   maintaining the first trim code during the testing.

7. An electronic circuit, comprising:
   a flash fuse cell array configured to store a first trim code, the fuse cell array comprising nonvolatile fuse cells;
   a trim code processor configured to generate a second trim code based on the first trim code and a voltage control code; and
   a regulator configured to generate a high voltage in response to the second trim codes,
   wherein the trim code processor comprises:
      a first register configured to store the first trim code received from the flash fuse cell array;
      a second register configured to store the voltage control code; and
      a calculator configured to calculate the second trim code based on the first trim code and the voltage control code.

8. The electronic circuit of claim 7, wherein the voltage control code is extracted from a test command received by the trim code processor, the voltage control code indicating a displacement value of the high voltage level.

9. The electronic circuit of claim 8, wherein the calculator is configured to one of add or subtract the voltage control code to or from the first trim code in response to the test command to calculate the second trim code.

10. The electronic circuit of claim 7, wherein first trim code stored in the flash fuse cell array is maintained while the high voltage is generated in response to the second trim code.

* * * * *